US007000168B2

(12) United States Patent
Kurtas et al.

(10) Patent No.: US 7,000,168 B2
(45) Date of Patent: Feb. 14, 2006

(54) METHOD AND CODING APPARATUS USING LOW DENSITY PARITY CHECK CODES FOR DATA STORAGE OR DATA TRANSMISSION

(75) Inventors: Erozan M. Kurtas, Pittsburgh, PA (US); Alexander Vasilievich Kuznetsov, Pittsburgh, PA (US); Bane Vasic, Tucson, AZ (US)

(73) Assignee: Seagate Technology LLC, Scotts Valley, CA (US)

( * ) Notice: Subject to any disclaimer, the term of this patent is extended or adjusted under 35 U.S.C. 154(b) by 357 days.

(21) Appl. No.: 10/093,926

(22) Filed: Mar. 8, 2002

(65) Prior Publication Data

US 2002/0188906 A1    Dec. 12, 2002

Related U.S. Application Data

(60) Provisional application No. 60/314,987, filed on Aug. 24, 2001, provisional application No. 60/296,223, filed on Jun. 6, 2001.

(51) Int. Cl.
*H03M 13/00*  (2006.01)

(52) U.S. Cl. .................... 714/755; 714/800; 714/801; 714/804

(58) Field of Classification Search ................ 714/755, 714/704, 786, 800, 804, 801
See application file for complete search history.

(56) References Cited

U.S. PATENT DOCUMENTS

| 4,295,218 | A |    | 10/1981 | Tanner ................... 371/40 |
|---|---|---|---|---|
| 5,446,747 | A |    | 8/1995  | Berrou .................. 371/45 |
| 5,491,359 | A |    | 2/1996  | May et al. .............. 257/373 |
| 5,506,437 | A |    | 4/1996  | May et al. .............. 257/373 |
| 5,729,560 | A |    | 3/1998  | Hagenauer et al. ...... 371/43.1 |
| 5,761,248 | A |    | 6/1998  | Hagenauer et al. ...... 375/340 |
| 6,023,783 | A |    | 2/2000  | Divsalar et al. ........ 714/792 |
| 6,079,028 | A |    | 6/2000  | Ozden et al. ............ 714/6 |
| 6,145,111 | A |    | 11/2000 | Crozier et al. .......... 714/755 |
| 6,658,621 | B1 | * | 12/2003 | Jamil et al. ............ 714/805 |
| 6,687,872 | B1 | * | 2/2004  | Oldfield et al. ......... 714/801 |
| 2003/0033570 | A1 | * | 2/2003 | Khannanov et al. ...... 714/755 |

OTHER PUBLICATIONS

O. Pothier, L. Brunel and J. Boutros, "A Low Complexity of FEC Scheme Based on the Intersection of Interleaved Block Codes," Vehicular Technology Conference, 1999 IEEE 49$^{th}$ Houston, Texas, USA, May 16-20, 1999, pp. 274-278.

J. W. Bond, S. Hui and H. Schmidt, "Constructing Low-Density Parity-Check Codes with Circulant Matrices," Information Theory and Networking Workshop, Metsovo, Greece, Jun. 27-Jul. 1, 1999, p. 52.

S. Zhao, K. W. Yates and K. Yasukawa, "Application of Kirkman Designs in Joint Detection Multiple Access Schemes," Spread Spectrum Techniques and Application Proceedings, IEEE 4$^{th}$ International Symposium on Mainz, Germany, Sep. 22-25, 1996, May 15, 1996, pp. 857-861.

(Continued)

*Primary Examiner*—Phung My Chung
(74) *Attorney, Agent, or Firm*—Westman, Champlin & Kelly P.A.

(57) ABSTRACT

A method of generating low density parity check codes for encoding data includes constructing a parity check matrix H from balanced incomplete block design (BIBD) in which a plurality B-sets which define the matrix have no more than one intersection point. The parity bits are then generated as a function of the constructed parity check matrix H.

19 Claims, 16 Drawing Sheets

OTHER PUBLICATIONS

L. R. Bahl, J. Cocke, F. Jelinek, and J. Raviv, "Optimal Decoding of Linear Codes for Minimizing Symbol Error Rate," IEEE Transactions on Information Theory, vol. IT-20, No. 2, pp. 284-287, Mar. 1974.

V. K. Bhargava, "(v, k, λ) Configurations and Self-Dual Codes," Information and Control, vol. 28, No. 4, pp. 352-355 Aug. 1975.

T. Mittelholzer, A. Dholakia and E. Eleftheriou, "Reduced-Complexity Decoding of Low Density Parity Check Codes for Generalized Partial Response Channels," IEEE Transactions on Magnetics, vol. 37, No. 2, pp. 721-729, Mar. 2001.

J. L. Fan, A. Friedmann, E. Kurtas, and S. McLaughlin, "Low Density Parity Check Codes for Magnetic Recording," Thirty-seventh Annual Allerton Conference on Communication, Control and Computing, Monticello, Illinois, pp. 1314-1323, Sep. 22-24, 1999.

J. Hagenauer and P. Hoeher, "A Viterbi Alorithm with Soft-Decision Outputs and its Applications," Dallas GLOBECOM '89, pp. 1680-1686, Nov. 27-30, 1989.

T. P. Kirkman, "Note on an Unanswered Prize Question," The Cambridge and Dublin Mathematical Journal, vol. 5, pp. 255-262, Aug. 23, 1850.

F. R. Kschischang and B. J. Frey, "Iterative Decoding of Compound Codes by Probability Propagation in Graphical Models," IEEE Journal on Selected Areas in Communications, vol. 16, No. 2, pp. 219-230, Feb. 1998.

K. Ho, M. H. Kane, B. M. Lairson, G. I. Noyes, J. C. Harig, and Y. K. Kim, "Data Storage and Retrieval Using Perpendicular Media and Magnetoresistive Read Transducer," IEEE Transactions on Magnetics, vol. 33, No. 4, pp. 2538-2542, Jul. 1997.

D. J. C. MacKay and R. M. Neal, "Good Codes based on Very Sparse Matrices," Cryptography and Coding, 5$^{th}$ IMA Conference in lecture notes in computer science, Colin Boyd Edition, vol. 1025, pp. 100-111, Dec. 18-20, 1995.

D. J. C. MacKay, "Good Error-Correcting Codes Based on Very Sparse Matrices," IEEE Transactions on Information Theory, vol. 45, No. 2, pp. 399-431, Mar. 1999.

R. J. McEliece, D. J. C. MacKay, and J.-F. Cheng, "Turbo Decoding as an Instance of Pearl's "Belief Propagation" Algorithm, " IEEE Transactions on Selected Areas in Communications, vol. 16, No. 2, pp. 140-152, Feb. 1998.

Y. Nakamura and H. Muraoka, "New Concepts for Perpendicular Magnetic Recording Hard Disk System," IEEE Transactions on Magnetics, vol. 27, No. 6, pp. 4555-4560, Nov. 1991.

E. Netto, "Zur Theorie der Tripelsysteme," Mathematische Annalen 42, pp. 143-152, 1893.

T. R. Oenning and J. Moon, "A Low-density Generator Matrix Interpretation of Parallel Concatenated Single Bit Parity Codes," IEEE Transactions on Magnetics, vol. 37, No. 2, pp. 737-741, Mar. 2001.

D. K. Ray-Chaudhuri and R. M. Wilson, "Solution of Kirkman's Schoolgirl Problem," Proceedings of the Symposium in Pure Mathematics of the American Mathematical Society, Los Angeles, California, pp. 187-203, Mar. 21-22, 1968.

T. Richardson, A. Shokrollahi, and R. Urbanke, "Design of Provably Good Low-Density Parity Check Codes," 2000 IEEE International Symposium on Information Theory, pp. 199, Jun. 25-30, 2000.

D. R. Stinson, "Frames for Kirkman Triple Systems," Discrete Mathematics 65, pp. 289-300, Jul. 1987.

R. M. Tanner, "Recursive Approach to Low Complexity Codes," IEEE Transactions on Information Theory, vol. IT-27, No. 5, pp. 533-547, Sep. 1981.

R. M. Wilson, "Cyclotomy and Difference Families in Elementary Abelian Groups," Journal of Number Theory, vol. 4, No. 1, pp. 17-47, Feb. 1972.

C. E. Shannon, "A Mathematical Theory of Communication," The Bell System Technical Journal, vol. 27, pp. 623-656, Oct. 1948.

N. Wiberg, H.-A.Loeliger, R. Kötter, "Codes and Iterative Decoding on General Graphs," European Transactions on Telecommunications, vol. 6, No. 5, pp. 513-525, Sep. 1995.

A. C. H. Ling, C. J. Colbourn, M. J. Grannell and T. S. Griggs, "Construction Techniques for Anti-Pasch Steiner Triple Systems," Journal of the London Mathematical Society, vol. 61, Part 3, pp. 641-657, Jun. 2000.

* cited by examiner $$A = \begin{bmatrix} 1 & 0 & 0 & 0 & 1 & 0 & 1 \\ 1 & 1 & 0 & 0 & 0 & 1 & 0 \\ 0 & 1 & 1 & 0 & 0 & 0 & 1 \\ 1 & 0 & 1 & 1 & 0 & 0 & 0 \\ 0 & 1 & 0 & 1 & 1 & 0 & 0 \\ 0 & 0 & 1 & 0 & 1 & 1 & 0 \\ 0 & 0 & 0 & 1 & 0 & 1 & 1 \end{bmatrix} \quad (1)$$

$$R = \frac{\lambda \frac{v(v-1)}{k(k-1)} - v}{\lambda \frac{v(v-1)}{k(k-1)}} \quad (2)$$

$$\Delta_1 = \begin{vmatrix} 0 & 6 & 4 \\ 1 & 0 & 5 \\ 3 & 2 & 0 \end{vmatrix} \quad (3)$$

$$[H_1 H_2 ... H_{t-1} H_t]\begin{bmatrix} m \\ p \end{bmatrix} = 0_{v \times 1} \quad (5)$$

$$[H_1 H_2 ... H_{t-1}] \times m = H_t \times p \quad (6)$$

$$\sum_{1 \leq i \leq t-1} H_i \times m^{(i)} = H_t \times p \quad (7)$$

$$p = H_t^{-1} \times \beta \quad (8)$$

FIG. 3-1

Pseudocode $\beta = 0$ for $1 \le j \le t-1$ $\quad h_1^{(i)}(B_i) = 1$ $\quad \beta_i = m_1^{(i)} h_1^{(i)}$ $\quad$ for $2 \le j \le v$ $\quad\quad h_j^{(i)} = S(h_{j-1}^{(i)})$ $\quad\quad \beta_i = \beta_i + m_j^{(i)} \cdot h_1^{(i)}$ $\quad$ end $\quad \beta = \beta + \beta_i$ end $p = H_i^{-1} \cdot \beta$ $$H^{(1)} = \begin{bmatrix} 1 & 0 & 0 & 0 & 0 & 1 & 0 \\ 0 & 1 & 0 & 0 & 0 & 0 & 1 \\ 1 & 0 & 1 & 0 & 0 & 0 & 0 \\ 0 & 1 & 0 & 1 & 0 & 0 & 0 \\ 0 & 0 & 1 & 0 & 1 & 0 & 0 \\ 0 & 0 & 0 & 1 & 0 & 1 & 0 \\ 0 & 0 & 0 & 0 & 1 & 0 & 1 \end{bmatrix}, H^{(2)} = \begin{bmatrix} 1 & 0 & 0 & 0 & 1 & 0 & 0 \\ 0 & 1 & 0 & 0 & 0 & 1 & 0 \\ 0 & 0 & 1 & 0 & 0 & 0 & 1 \\ 1 & 0 & 0 & 1 & 0 & 0 & 0 \\ 0 & 1 & 0 & 0 & 1 & 0 & 0 \\ 0 & 0 & 1 & 0 & 0 & 1 & 0 \\ 0 & 0 & 0 & 1 & 0 & 0 & 1 \end{bmatrix}, H^{(3)} = \begin{bmatrix} 1 & 0 & 0 & 0 & 0 & 0 & 1 \\ 1 & 1 & 0 & 0 & 0 & 0 & 0 \\ 0 & 1 & 1 & 0 & 0 & 0 & 0 \\ 0 & 0 & 1 & 1 & 0 & 0 & 0 \\ 0 & 0 & 0 & 1 & 1 & 0 & 0 \\ 0 & 0 & 0 & 0 & 1 & 1 & 0 \\ 0 & 0 & 0 & 0 & 0 & 1 & 1 \end{bmatrix} \quad (10)$$

$$H^{(1)} = \begin{bmatrix} 1 & 0 & 0 & 0 & 0 & 1 & 0 \\ 0 & 1 & 0 & 0 & 0 & 0 & 1 \\ 1 & 0 & 1 & 0 & 0 & 0 & 0 \\ 0 & 1 & 0 & 1 & 0 & 0 & 0 \\ 0 & 0 & 1 & 0 & 1 & 0 & 0 \\ 0 & 0 & 0 & 1 & 0 & 1 & 0 \end{bmatrix}, H^{(2)} = \begin{bmatrix} 1 & 0 & 0 & 0 & 1 & 0 & 0 \\ 0 & 1 & 0 & 0 & 0 & 1 & 0 \\ 0 & 0 & 1 & 0 & 0 & 0 & 1 \\ 1 & 0 & 0 & 1 & 0 & 0 & 0 \\ 0 & 1 & 0 & 0 & 1 & 0 & 0 \\ 0 & 0 & 1 & 0 & 0 & 1 & 0 \end{bmatrix},$$

$$H^{(3)} = \begin{bmatrix} 1 & 0 & 0 & 0 & 0 & 0 \\ 1 & 1 & 0 & 0 & 0 & 0 \\ 0 & 1 & 1 & 0 & 0 & 0 \\ 0 & 0 & 1 & 1 & 0 & 0 \\ 0 & 0 & 0 & 1 & 1 & 0 \\ 0 & 0 & 0 & 0 & 1 & 1 \end{bmatrix} \text{ and } \left(H^{(3)}\right)^{-1} = \begin{bmatrix} 1 & 0 & 0 & 0 & 0 & 0 \\ 1 & 1 & 0 & 0 & 0 & 0 \\ 1 & 1 & 1 & 0 & 0 & 0 \\ 1 & 1 & 1 & 1 & 0 & 0 \\ 1 & 1 & 1 & 1 & 1 & 0 \\ 1 & 1 & 1 & 1 & 1 & 1 \end{bmatrix} \quad (11)$$

FIG._ 3-2

TABLE 1
THE ORBITS OF BASE BLOCKS (0,1,4) AND (0,2,7) IN A (13,3,1) BIBD

| $B_1$ orbits | | | $B_2$ orbits | | |
|---|---|---|---|---|---|
| $b_{11}+g$ | $b_{12}+g$ | $b_{13}+g$ | $b_{21}+g$ | $b_{22}+g$ | $b_{23}+g$ |
| 0 | 1 | 4 | 0 | 2 | 7 |
| 1 | 2 | 5 | 1 | 3 | 8 |
| 2 | 3 | 6 | 2 | 4 | 9 |
| 3 | 4 | 7 | 3 | 5 | 10 |
| 4 | 5 | 8 | 4 | 6 | 11 |
| 5 | 6 | 9 | 5 | 7 | 12 |
| 6 | 7 | 10 | 6 | 8 | 0 |
| 7 | 8 | 11 | 7 | 9 | 1 |
| 8 | 9 | 12 | 8 | 10 | 2 |
| 9 | 10 | 0 | 9 | 11 | 3 |
| 10 | 11 | 1 | 10 | 12 | 4 |
| 11 | 12 | 2 | 11 | 0 | 5 |
| 12 | 0 | 3 | 12 | 1 | 6 |

TABLE 2
SOME SMALL PRIME POWER $(v,3,1)$ CYCLIC DIFFERENCE FAMILIES

| v | $B_1$ | $B_2$ | $B_3$ | $B_4$ | $B_5$ | $B_6$ | $B_7$ |
|---|---|---|---|---|---|---|---|
| 7 | 0 1 3 | | | | | | |
| 13 | 0 1 4 | 0 2 7 | | | | | |
| 19 | 0 1 4 | 0 2 9 | 0 5 11 | | | | |
| 31 | 0 1 12 | 0 2 24 | 0 3 8 | 0 4 17 | 0 6 16 | | |
| 37 | 0 1 3 | 0 4 26 | 0 5 14 | 0 6 25 | 0 7 17 | 0 8 21 | |
| 43 | 0 1 3 | 0 4 9 | 0 6 28 | 0 7 23 | 0 8 33 | 0 11 30 | 0 12 26 |

FIG._3-3

TABLE 3
SOME "HIGH RATE" PRIME POWER KIRKMAN ($v$,3,1) CDFs

| $v = 61$ | $v = 67$ | $v = 73$ | $v = 79$ | $v = 97$ | $v = 103$ |
|---|---|---|---|---|---|
| $b = 610$ $R = 0.900$ | $b = 737$ $R = 0.909$ | $b = 876$ $R = 0.917$ | $b = 10279$ $R = 0.923$ | $b = 1552$ $R = 0.948$ | $b = 1751$ $R = 0.942$ |
| 2,33,26 | 2,7,58 | 5,40,28 | 3,69,7 | 5,78,14 | 5,74,24 |
| 4,5,52 | 4,14,49 | 25,54,67 | 9,49,21 | 25,2,70 | 25,61,17 |
| 8,10,43 | 8,28,31 | 52,51,43 | 27,68,63 | 28,10,59 | 22,99,85 |
| 16,20,25 | 16,56,62 | 41,36,69 | 2,46,31 | 43,50,4 | 7,83,13 |
| 32,40,50 | 32,45,57 | 59,34,53 | 6,59,14 | 21,56,20 | 35,3,65 |
| 3,19,39 | 64,23,47 | 3,24,46 | 18,19,42 | 8,86,3 | 72,15,16 |
| 6,38,17 | 61,46,27 | 15,47,11 | 54,57,47 | 40,42,15 | 51,75,80 |
| 12,15,34 | 55,25,54 | 2,16,55 | 4,13,62 | 6,16,75 | 49,66,91 |
| 24,30,7 | 43,50,41 | 10,7,56 | 12,39,28 | 30,80,84 | 39,21,43 |
| 48,60,14 | 19,33,15 | 50,35,61 | 36,38,5 | 53,12,32 | 92,2,9 |
|  | 38,66,30 | 31,29,13 | 29,35,15 | 71,60,63 | 48,10,45 |
|  |  | 9,72,65 | 8,26,45 | 64,9,24 | 34,50,19 |
|  |  |  | 24,78,56 | 29,45,23 | 67,44,95 |
|  |  |  |  | 48,31,18 | 26,14,63 |
|  |  |  |  | 46,58,90 | 27,70,6 |
|  |  |  |  | 36,96,62 | 32,41,30 |
|  |  |  |  |  | 57,102,47 |

FIG._3-4a

TABLE 4
HIGH RATE KIRKMAN (v,3,1) CDF WITH A NUMBER OF BLOCKS
(CODE LENGTH) SMALLER THAN A SECTOR SIZE

| v = 109 | v = 121 | v = 127 | v = 139 | v = 151 | v = 157 |
|---|---|---|---|---|---|
| b = 1962<br>R = 0.944 | b = 2420<br>R = 0.950 | b = 2667<br>R = 0.952 | b = 3197<br>R = 0.957 | b = 3775<br>R = 0.960 | b = 4082<br>R = 0.962 |
| 6,51,52 | 11,38,83 | 3,67,57 | 2,53,84 | 6,41,104 | 5,60,92 |
| 36,88,94 | 114,23,116 | 9,74,44 | 4,106,29 | 36,95,20 | 25,143,146 |
| 107,92,19 | 62,118,84 | 27,95,5 | 8,73,58 | 65,117,120 | 125,87,102 |
| 97,7,5 | 31,106,6 | 81,31,15 | 16,7,116 | 88,98,116 | 154,121,39 |
| 37,42,30 | 85,102,66 | 116,93,45 | 32,14,93 | 75,135,92 | 142,134,38 |
| 4,34,71 | 17,58,57 | 94,25,8 | 64,28,47 | 148,55,99 | 82,42,33 |
| 24,95,99 | 59,108,97 | 28,75,24 | 128,56,94 | 133,28,141 | 96,53,8 |
| 35,25,49 | 119,3,21 | 84,98,72 | 117,112,49 | 43,17,91 | 9,108,40 |
| 101,41,76 | 117,33,103 | 125,40,89 | 95,85,98 | 107,102,93 | 45,69,43 |
| 61,28,20 | 95,89,69 | 121,120,13 | 51,31,57 | 38,8,105 | 68,31,58 |
| 39,59,11 | 120,54,90 | 109,106,39 | 102,62,114 | 77,48,26 | 26,155,133 |
| 16,27,66 | 7,71,65 | 73,64,117 | 65,124,89 | 9,137,5 | 130,147,37 |
| 96,53,69 | 77,112,64 | 92,65,97 | 130,109,39 | 54,67,30 | 22,107,28 |
| 31,100,87 | 50,40,53 | 22,68,37 | 121,79,78 | 22,100,29 | 110,64,140 |
| 77,55,86 | 27,45,60 | 66,77,111 | 103,19,17 | 132,147,23 | 79,6,72 |
| 26,3,80 | 41,93,9 | 71,104,79 | 67,38,34 | 37,127,138 | 81,30,46 |
| 47,18,44 | 56,98,99 | 86,58,110 | 134,76,68 | 71,7,73 | 91,150,73 |
| 64,108,46 | 86,32,25 | 4,47,76 | 129,13,136 | 124,42,136 | 141,122,51 |
|  | 28,96,19 | 12,14,101 | 119,26,133 | 140,101,61 | 77,139,98 |
|  | 52,10,81 | 36,42,49 | 99,52,127 | 85,2,64 | 71,67,19 |
|  |  | 108,126,20 | 59,104,115 | 57,12,82 | 41,21,95 |
|  |  |  | 118,69,91 | 40,72,39 | 48,105,4 |
|  |  |  | 97,138,43 | 89,130,83 | 83,54,20 |
|  |  |  |  | 81,25,45 | 101,113,100 |
|  |  |  |  | 33,150,119 | 34,94,29 |
|  |  |  |  |  | 13,156,145 |

FIG._3-4b

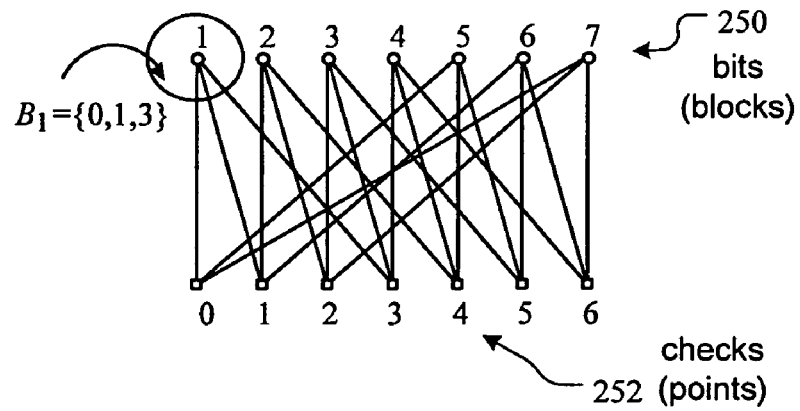
The bipartite graph of the LDPC code
(example for the Kirkman (7,3,1) system)
FIG.−4
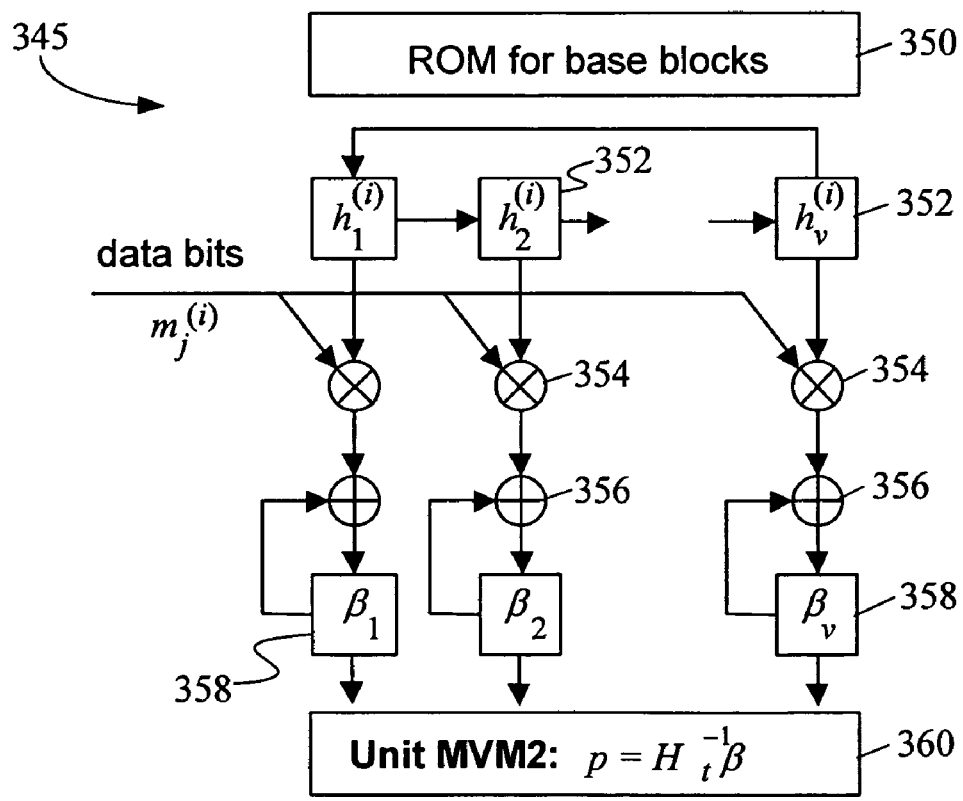
FIG.−8

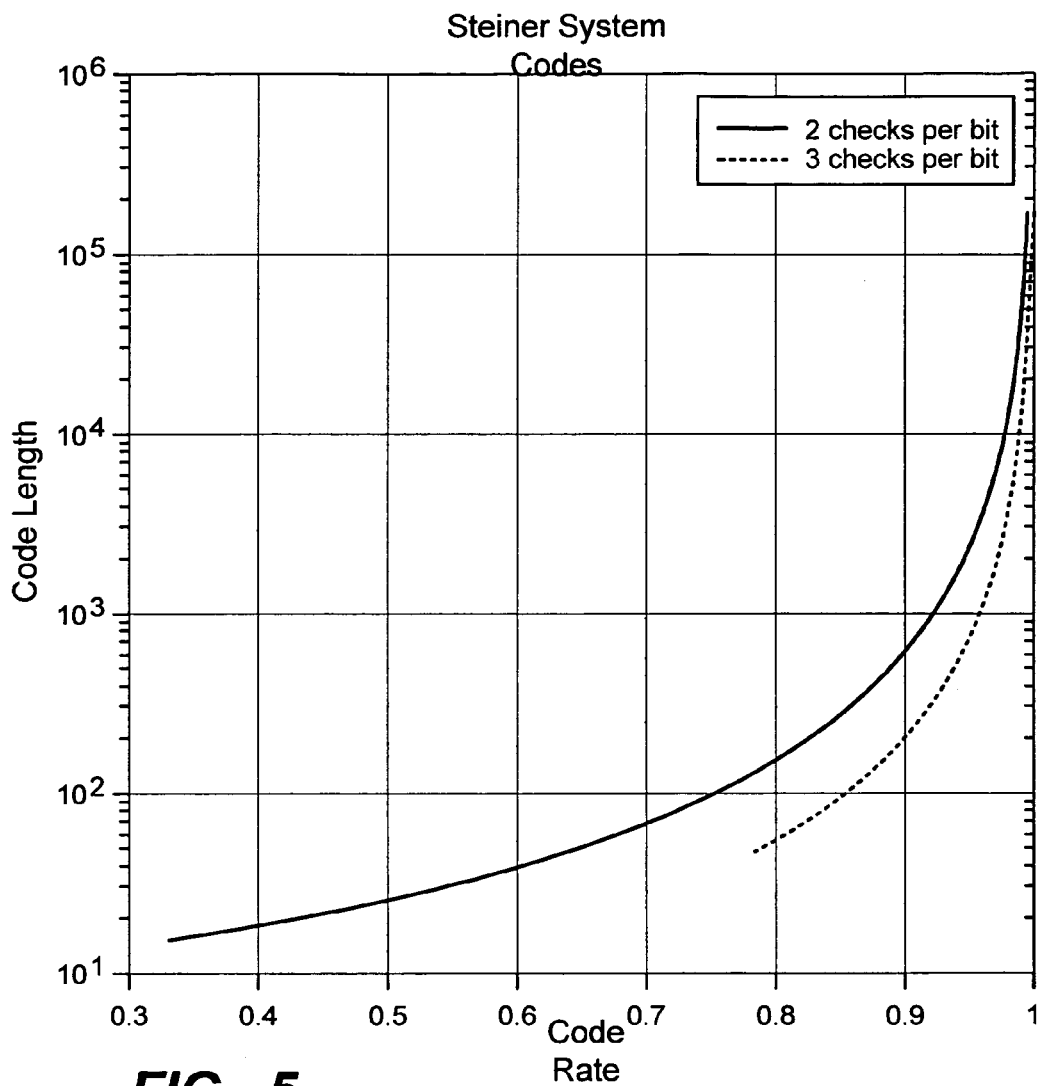
FIG._5
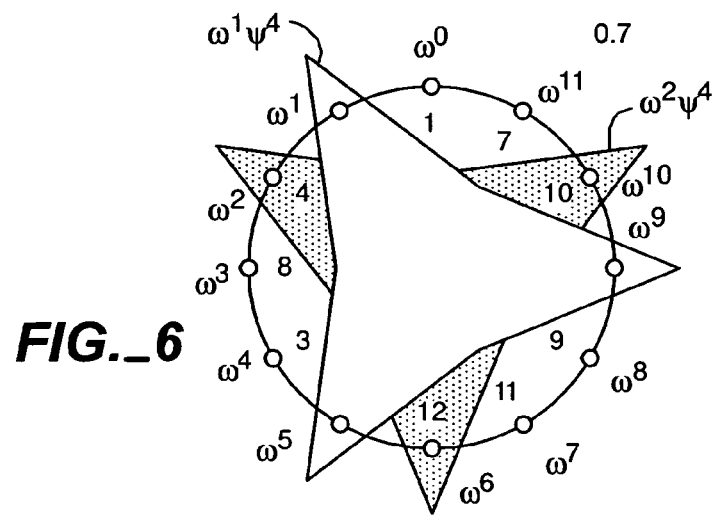
FIG._6

Structure of the new LDPC codes

Parity check matrix: n - code length, k - number of user bits, redundancy r=n-k $$H = \begin{bmatrix} \underbrace{\begin{matrix} 1 & 0 & 0 & 0 & \cdots & 1 & 0 & 0 \\ 0 & 1 & 0 & 0 & \cdots & 0 & 1 & 0 \\ 0 & 0 & 1 & 0 & \cdots & 0 & 0 & 1 \\ \vdots & & & & & & & \vdots \\ 0 & 1 & 0 & 0 & \cdots & 0 & 1 & 0 \\ 0 & 0 & 1 & 0 & \cdots & 1 & 0 & 0 \end{matrix}}_{302} & \underbrace{\begin{matrix} 1 & 0 & 0 & 1 & \cdots & 0 & 0 & 1 \\ 0 & 1 & 0 & 1 & \cdots & 0 & 1 & 0 \\ 0 & 0 & 1 & 0 & \cdots & 0 & 1 & 0 \\ \vdots & & & & & & & \vdots \\ 0 & 1 & 0 & 0 & \cdots & 0 & 1 & 0 \\ 0 & 0 & 1 & 0 & \cdots & 0 & 0 & 1 \end{matrix}}_{304} & \cdots & \underbrace{\begin{matrix} 1 & 0 & 0 & 0 & \cdots & 1 & 1 & 0 \\ 0 & 1 & 0 & 0 & \cdots & 0 & 1 & 1 \\ \vdots & & & & & & & \vdots \\ 0 & 1 & 1 & 0 & \cdots & 0 & 0 & 0 \\ 0 & 0 & 1 & 1 & \cdots & 0 & 0 & 0 \end{matrix}}_{306} \end{bmatrix} \updownarrow m$$

← Number of base blocks t →

Example: Kirkman 163: J=3, m=163, t=27, n=mt=4401

*FIG.–7*

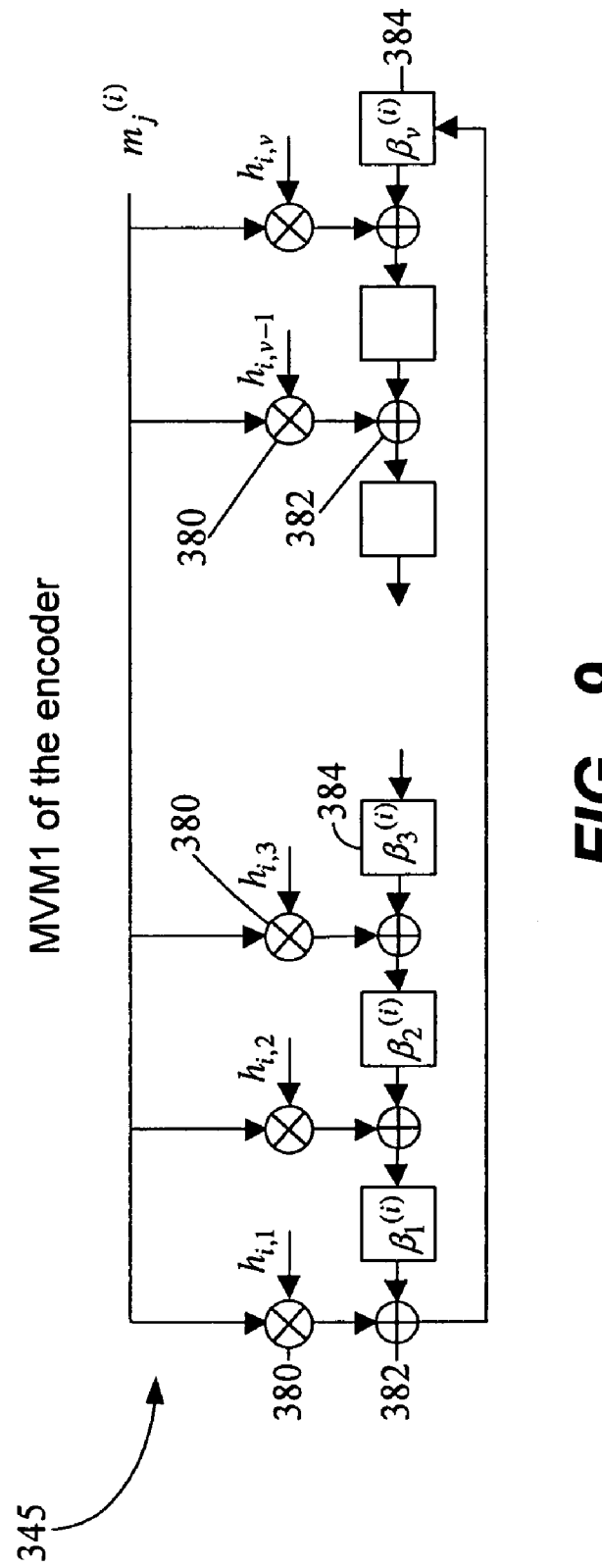
FIG._9

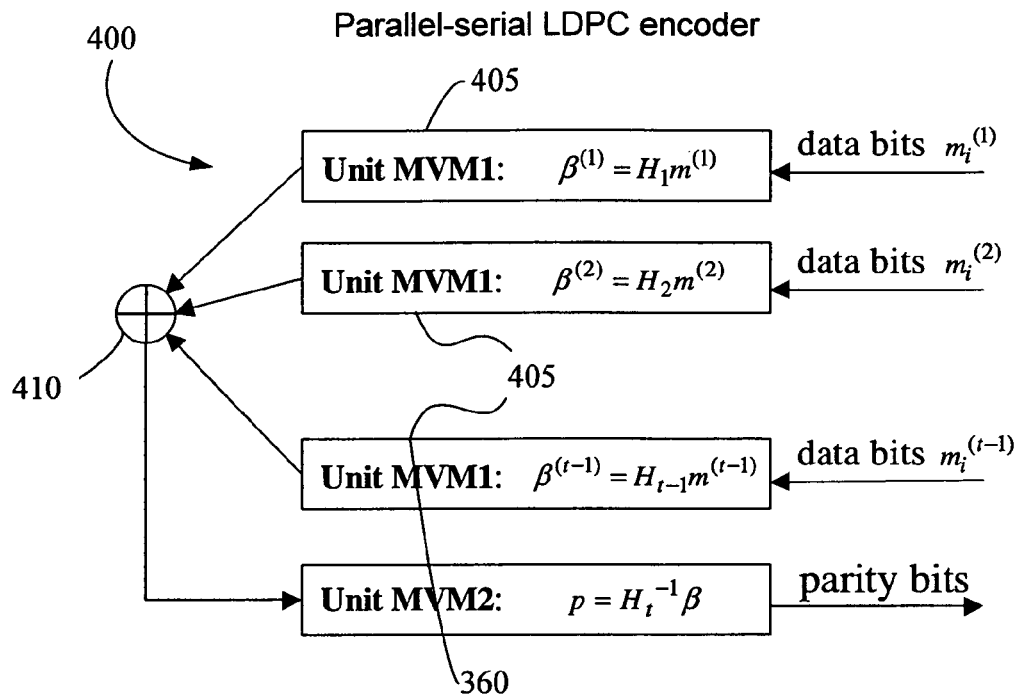

FIG._10

Parity-check matrix for (13,3,1) Kirkman system $$H = \begin{bmatrix} 1 & 0 & 0 & 0 & 0 & 0 & 0 & 0 & 1 & 0 & 0 & 1 & 1 & 0 & 0 & 0 & 0 & 1 & 0 & 0 & 0 & 1 & 0 \\ 1 & 1 & 0 & 0 & 0 & 0 & 0 & 0 & 0 & 1 & 0 & 0 & 0 & 1 & 0 & 0 & 0 & 0 & 1 & 0 & 0 & 0 & 1 \\ 0 & 1 & 1 & 0 & 0 & 0 & 0 & 0 & 0 & 0 & 1 & 0 & 1 & 0 & 1 & 0 & 0 & 0 & 0 & 1 & 0 & 0 & 0 \\ 0 & 0 & 1 & 1 & 0 & 0 & 0 & 0 & 0 & 0 & 0 & 1 & 0 & 1 & 0 & 1 & 0 & 0 & 0 & 0 & 1 & 0 & 0 \\ 1 & 0 & 0 & 1 & 1 & 0 & 0 & 0 & 0 & 0 & 0 & 0 & 0 & 0 & 1 & 0 & 1 & 0 & 0 & 0 & 0 & 1 & 0 \\ 0 & 1 & 0 & 0 & 1 & 1 & 0 & 0 & 0 & 0 & 0 & 0 & 0 & 0 & 0 & 1 & 0 & 1 & 0 & 0 & 0 & 0 & 1 \\ 0 & 0 & 1 & 0 & 0 & 1 & 1 & 0 & 0 & 0 & 0 & 0 & 0 & 0 & 0 & 0 & 1 & 0 & 1 & 0 & 0 & 0 & 0 \\ 0 & 0 & 0 & 1 & 0 & 0 & 1 & 1 & 0 & 0 & 0 & 0 & 1 & 0 & 0 & 0 & 0 & 1 & 0 & 1 & 0 & 0 & 0 \\ 0 & 0 & 0 & 0 & 1 & 0 & 0 & 1 & 1 & 0 & 0 & 0 & 0 & 1 & 0 & 0 & 0 & 0 & 1 & 0 & 1 & 0 & 0 \\ 0 & 0 & 0 & 0 & 0 & 1 & 0 & 0 & 1 & 1 & 0 & 0 & 0 & 0 & 1 & 0 & 0 & 0 & 0 & 1 & 0 & 1 & 0 \\ 0 & 0 & 0 & 0 & 0 & 0 & 1 & 0 & 0 & 1 & 1 & 0 & 0 & 0 & 1 & 0 & 0 & 0 & 0 & 1 & 0 & 1 & 0 \\ 0 & 0 & 0 & 0 & 0 & 0 & 0 & 1 & 0 & 0 & 1 & 1 & 0 & 0 & 0 & 0 & 1 & 0 & 0 & 0 & 0 & 1 & 0 & 1 \end{bmatrix}$$ (9)

FIG._11

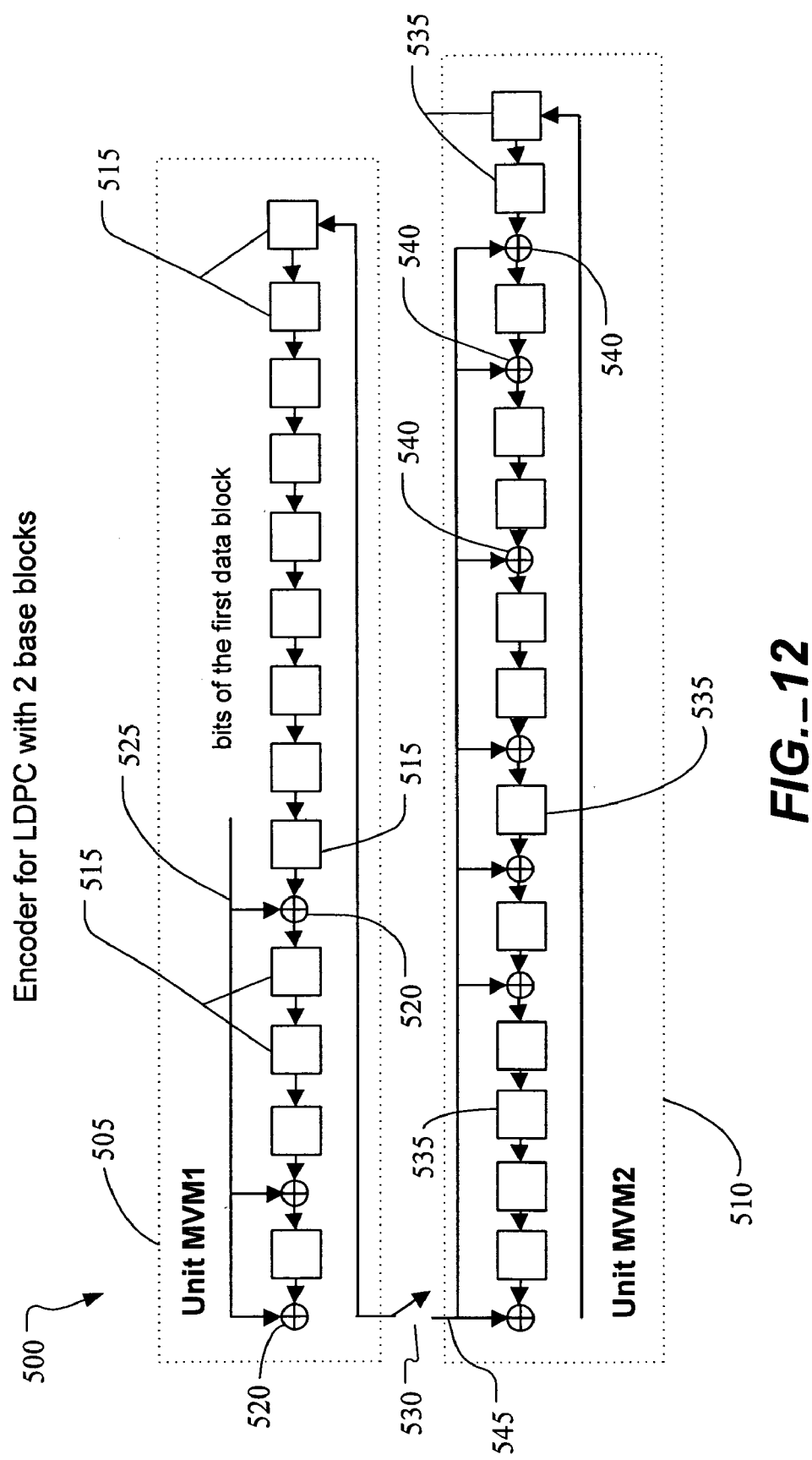
FIG._12

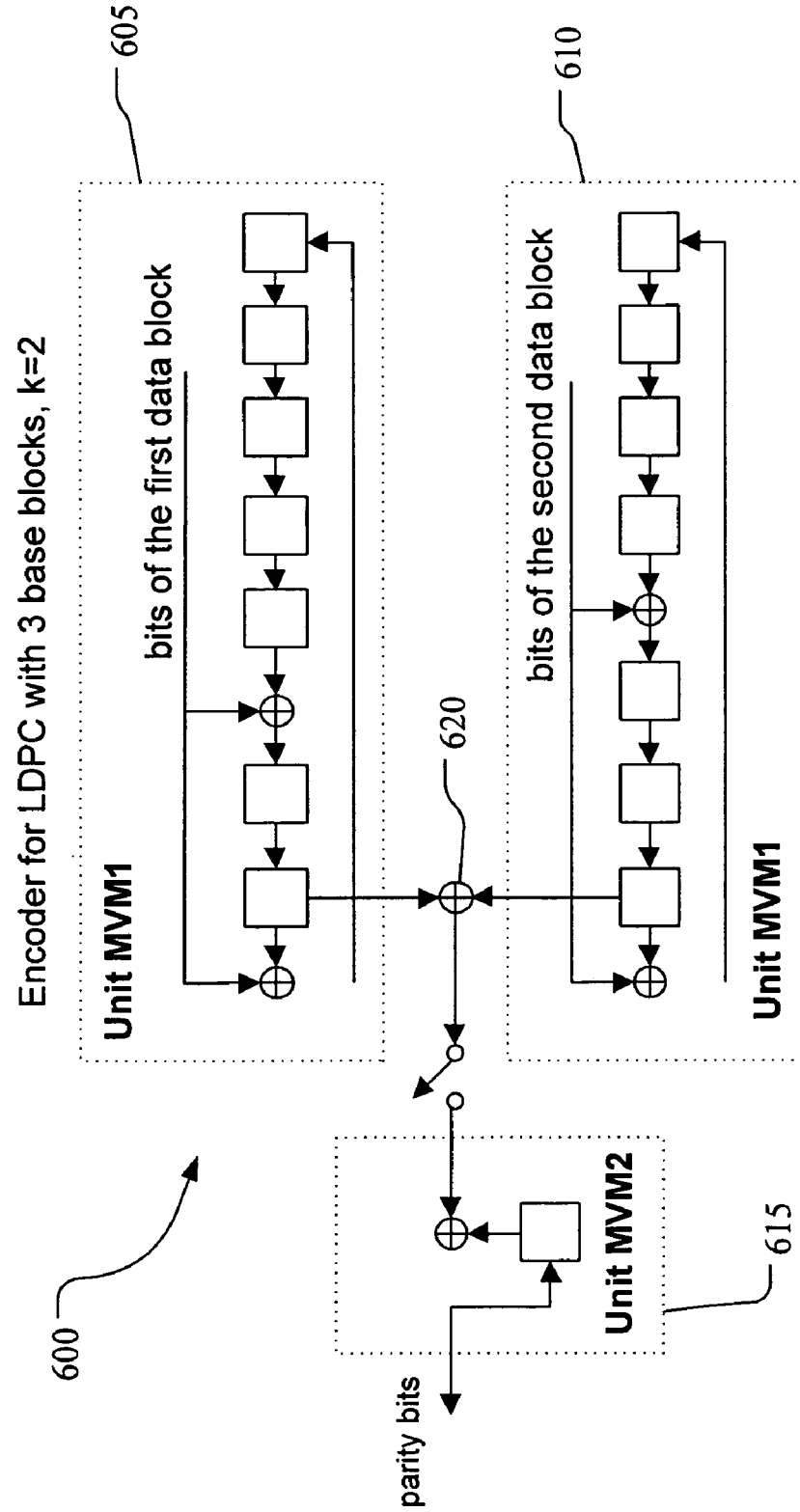
FIG._13

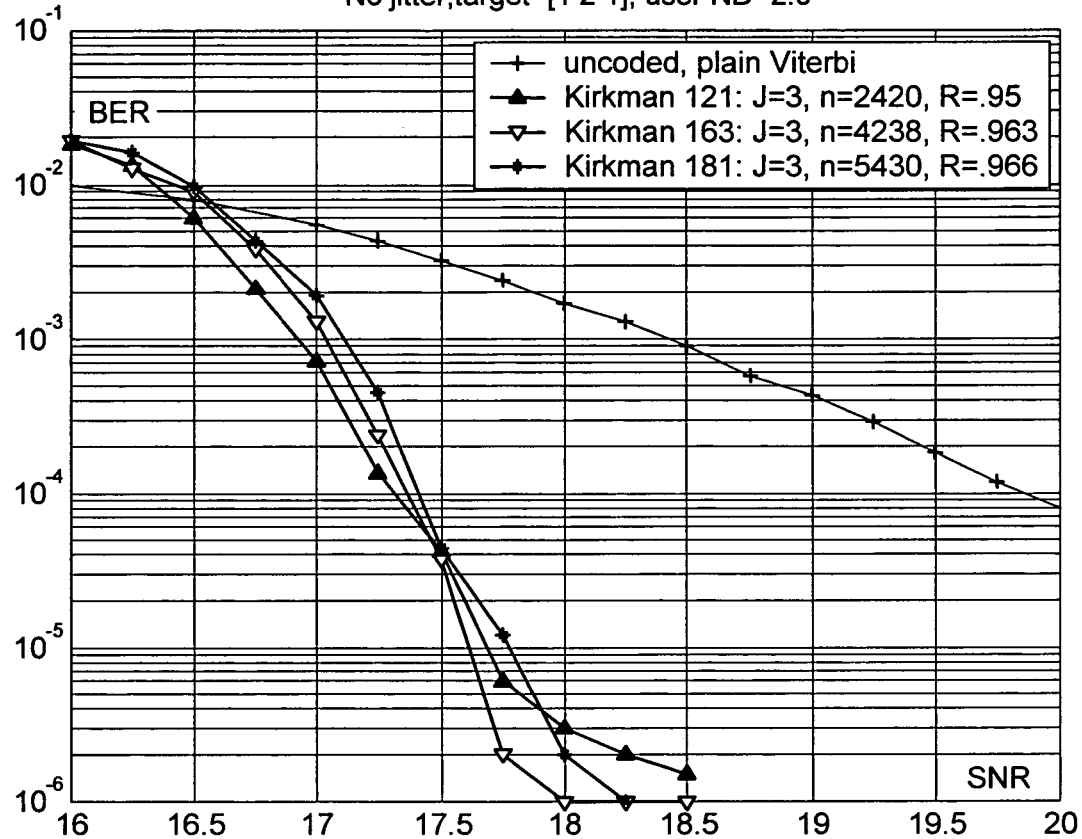
FIG._14

METHOD AND CODING APPARATUS USING LOW DENSITY PARITY CHECK CODES FOR DATA STORAGE OR DATA TRANSMISSION

CROSS-REFERENCE TO RELATED APPLICATION

This application claims priority from U.S. Provisional Application No. 60/296,223, filed Jun. 6, 2001, and entitled "METHOD AND CODING USING LOW DENSITY PARITY CHECK CODES FOR DATA STORAGE OR DATA TRANSMISSION", AND U.S. Provisional Application No. 60/314,987, filed Aug. 24, 2001, and entitled "A METHOD AND CODING MEANS USING ANTI-PASCH LDPC CODES".

FIELD OF THE INVENTION

The invention relates generally to data storage and/or communication systems. More particularly, the invention relates to the use of iterative soft and hard decoding of Low Density Parity Check Codes (LDPCs) for the improvement of bit error rates.

BACKGROUND OF THE INVENTION

Since its invention in the mid-sixties, the Viterbi algorithm (VA) has been a very efficient method for data detection in communication and storage systems. The Soft-Output Viterbi Algorithm (SOVA) is a modification of the VA that gives the most likely path sequence in the trellis as well as the "a posteriori" probability for each transmitted bit. Similar a posteriori probabilities (soft outputs) are also given by the BCJR (Bahl, Cocke, Jelinek and Raviv) algorithms which are widely known in the art. These algorithms, when combined with a soft decoding scheme for convolutional modulation codes, form efficient iterative "turbo" decoding schemes. Both SOVA and BCJR can be used in the Partial Response (PR) channels that exist in many communication and storage systems. Although the Bit Error Rates (BERs) of such schemes approach record low levels, the complexity of their implementation and the time delays involved pose serious problems.

It was discovered that in additive Gaussian noise channels the long Gallager codes can achieve near optimal performance. In the past few years several low density parity check codes (LDPCs) have been designed with performances very close to the theoretical limit. Also, a significant insight into iterative decoding has been gained due to interpretation of Message Passing Algorithm (MPA) in terms of belief propagation in graphical models. A graphical model that uses message passing terminology was introduced. Despite this tremendous progress, the code complexity issues were left aside. Although the considerations related to high capacity, speed and error performance are important, the complexity factors tend to dominate system architecture and design considerations, especially in extremely high speed applications such as magnetic recording.

Iterative decoders proposed in the art have been of very high complexity, and are believed to be incapable of operating in the faster than 1 Gbps regime—a speed common in current magnetic recording read channels. The high complexity of the proposed schemes is a direct consequence of the fact that, in random codes, a large amount of information is necessary to specify positions of the nonzero elements in a parity check matrix. The application of LDPCs in magnetic recording has been an active research area during the past several years. The results of several studies have been recently reported and several schemes based on random codes have been proposed. However, these schemes have not offered sufficient coding gains to justify the increase in encoder/decoder complexity which would be required.

A first difficulty in designing a code for magnetic recording is the fact that the code rate must be high (8/9 or higher), because it is practically impossible to compensate for a rate loss by any improved detection technique of reasonable complexity, especially at high recording densities. A second limiting factor is thermal asperities. A thermal asperity occurs when, for example, a read head hits a dust particle on the disc. A Thermal asperity can produce a burst of errors having a length that cannot be corrected even by a very powerful code, in which case a sector read retry must be performed.

A traditional method of coping with thermal asperities is to use a high rate error event detecting block code concatenated with the Reed-Solomon (RS) code. An alternative is to replace the RS code with the longer iteratively decodable code, but no results with realistic channel models have been reported so far.

A method of overcoming the aforementioned problems would be a significant improvement in the art.

SUMMARY OF THE INVENTION

The present invention addresses the aforementioned problems by providing a novel method and apparatus for encoding digital information to be transmitted through a communication channel or recorded on a recording medium. The method preferably uses Kirkman codes for encoding user bits. The invention also provides a method and apparatus for decoding information transmitted through the communication channel or stored on a recording medium.

A combinatorial construction of a class of high rate iteratively decodable codes using Balanced Incomplete Block Design (BIBD), in particular Steiner (v,3,1)-systems, is proposed. This construction gives parity check matrices with column weights of 3 and minimum girths of 4, 6 and higher. These systems are constructed using cyclic difference families of $Z_v$ with $v \equiv 1 \mod 6$, v prime power. The complexity of these codes is extremely low and is basically determined by the size of a difference family that the block design is a based upon. A hardware efficient encoding algorithm that exploits a cyclic structure of the new codes has been also proposed.

Groups other than $Z_v$ can also lead to a low complexity implementation. Different choices of groups may reduce the effect of propagation of error events in MPA. The systematical solution of this problem involves searching over all non-isomorphic groups, and removing groups with fixed points since such groups support localized message passing (the equivalent effect is produced by a bad interleaver). On the other hand, the groups with small Pasch factors, i.e. a small number of 4 set blocks (bits) sharing 6 points (equations), should be favored since they prevent a local message passing.

These and various other features as well as advantages which characterize embodiments of the present invention will be apparent upon reading of the following detailed description and review of the associated drawings.

BRIEF DESCRIPTION OF THE DRAWINGS

FIGS. 3-1 and 3-2 illustrate Equations and Pseudocode used to describe the present invention.

FIGS. 3-3 and 3-4 illustrate Tables used to describe aspects of the present invention.

FIG. 4 is a bipartite graph of a low density parity check (LDPC) code for a Kirkman (7,3,1) system.

FIG. 5 is a graph plotting code length versus code rate for Steiner system codes.

FIG. 6 is a diagrammatic depiction of a GF(6t+1) cyclic difference family.

FIG. 7 is a diagrammatic illustration of the structure of a low density parity check matrix in accordance with some embodiments of the invention.

FIG. 8 is a block diagram illustrating an encoder in accordance with some embodiments of the present invention.

FIG. 9 is a block diagram illustrating a first portion of the encoder shown in FIG. 8 in accordance with some embodiments of the present invention.

FIG. 10 is a block diagram illustrating a parallel-serial encoder in accordance with some embodiments of the present invention.

FIG. 11 is a parity check matrix for a Kirkman (13,3,1) system.

FIG. 12 is a block diagram illustrating an encoder for a LDPC code with two base blocks.

FIG. 13 is a block diagram illustrating an encoder for a LDPC code with three base blocks.

FIG. 14 is a graph plotting bit error rates (BERs) of different Kirkman LDPC codes.

DETAILED DESCRIPTION OF ILLUSTRATIVE EMBODIMENTS

The present invention includes well-structured low-density parity check codes, as well as a method and apparatus for their encoding and decoding. A parity check matrix of these codes is completely determined by a set of few parameters, and can lead to a very low complexity implementation. Although the bipartite graphs are quite useful tools for visualizing message-passing algorithms, they are not as convenient in code design. The construction described herein is purely combinatorial. The construction is simpler compared to prior art constructions, and is based on Balanced Incomplete Block Designs (BIBDs). More specifically, the codes of the present invention are based on Steiner triple systems and $Z_v$ groups, where v is the number of the parity check equations describing the code. The BIBDs are constructed using Netto's difference families and $Z_v$, where v is prime power, and show that the complexity of these codes is extremely low and is basically determined by the size of the difference family that a block design is based upon. A hardware efficient encoding algorithm that exploits the cyclic structure of the BIBD is also proposed.

In order to assess the performance of the proposed codes, a system has been considered in which soft information is extracted from the partial response channel using BCJR or SOVA operating on the channel trellis, and then passed forth and back from BCJR or SOVA to a message passing algorithm (MPA). The motivation for using this setting is to understand the potential of Steiner-type codes in a decoding scheme that has a relatively low implementation complexity in read channel chips operating at speeds above 1 Gbps. Although generic methods and apparatus were described in the literature for encoding and decoding any linear code, when applied to the proposed LDPC codes at the current level of VLSI technology, they cannot be implemented in hardware for the most efficient long codes. The methods and apparatus described herein overcome these limitations.

Figure 1:
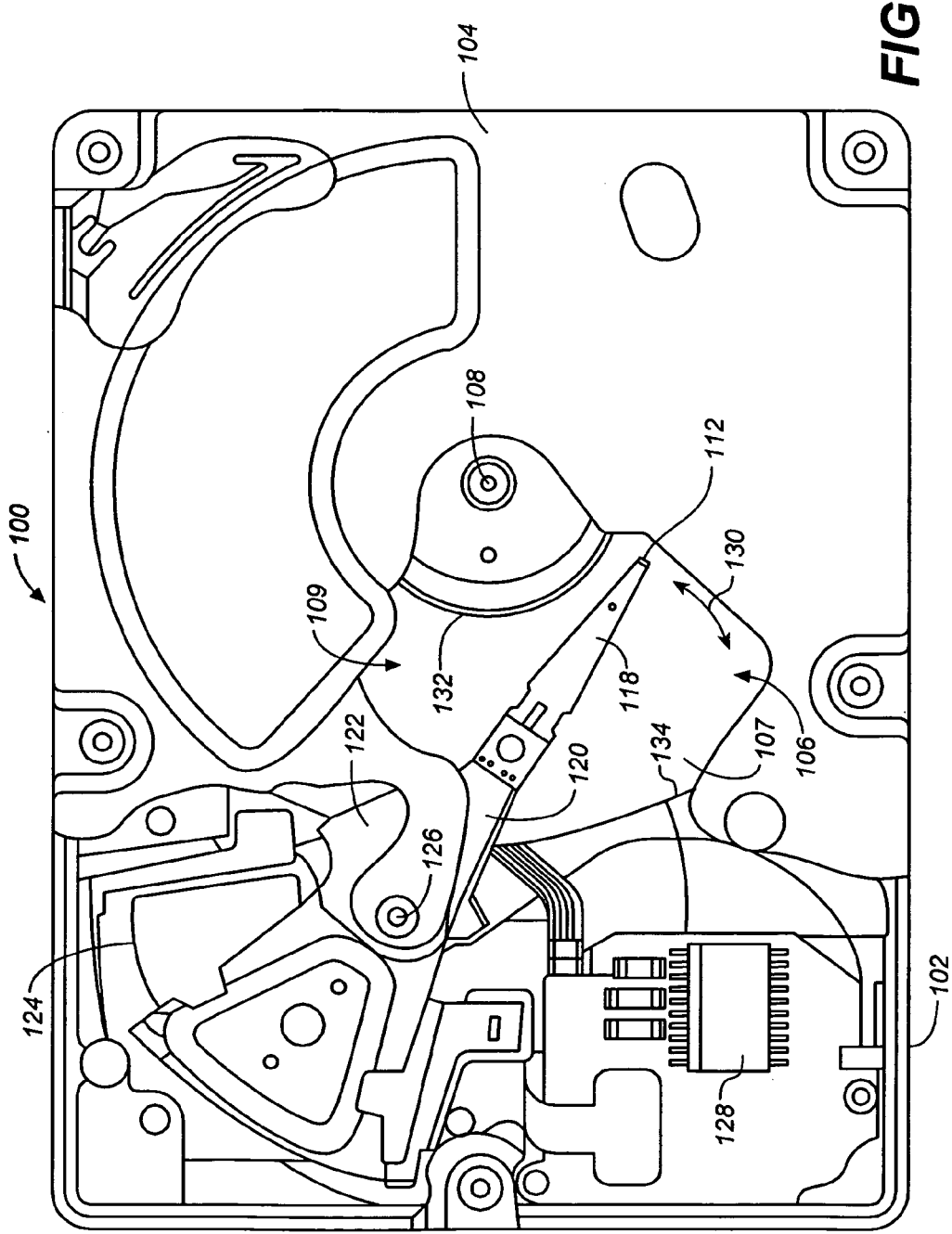
FIG. 1 is a plan view of a disc drive in accordance with embodiments of the present invention.

FIG. 1 is a plan view of a disc drive 100 which includes a housing with a base 102 and a top cover 104 (sections of top cover 104 are removed for clarity). Disc drive 100 further includes a disc pack 106 which is mounted on a spindle motor (not shown). Disc pack 106 includes a plurality of individual discs 107 which are mounted for co-rotation about central axis 108. Each disc 107 has an associated product head 112 which carries one or more read and write transducers (read and write heads) for communicating with disc surface 109. Each product head 112 is supported by a suspension 118 which is in turn attached to a track accessing arm 120 of an actuator assembly 122. Actuator assembly 122 is rotated about a shaft 126 by a voice coil motor 124, which is controlled by servo control circuitry, to move head 112 in an arcuate path 130 between a disc inner diameter 132 and a disc outer diameter 134.

Also shown in FIG. 1 is circuitry 128 which diagrammatically represents circuitry associated with the channel architecture used in processing signals to be written to or read from the disc or media surface. The position in which circuitry 128 is located need not be as shown in FIG. 1, but instead, the position of circuitry 128 shown in FIG. 1 is provided as an example for discussion purposes. Further, disc drive 100 is intended to represent any of a variety of data storage devices in which the methods and apparatus of the present invention can be implemented. For example, in one embodiment, disc drive 100 is a magnetic disc drive utilizing perpendicular recording techniques and components. However, in other embodiments, disc drive 100 can be other types of magnetic disc drive, or can be other types of disc drive such as an optical disc drive, a magneto-optical disc drive, etc. The methods and apparatus disclosed herein can also be used in other data storage devices, for example in magnetic tape storage devices. Further still, the methods and apparatus of the present invention can be used in environments other than data storage systems. For instance, the methods and apparatus of the present invention can also be used in communication systems. The following discussion, though directed specifically to data storage systems at times, is intended to be applicable to all such uses of the present invention.

Figure 2:
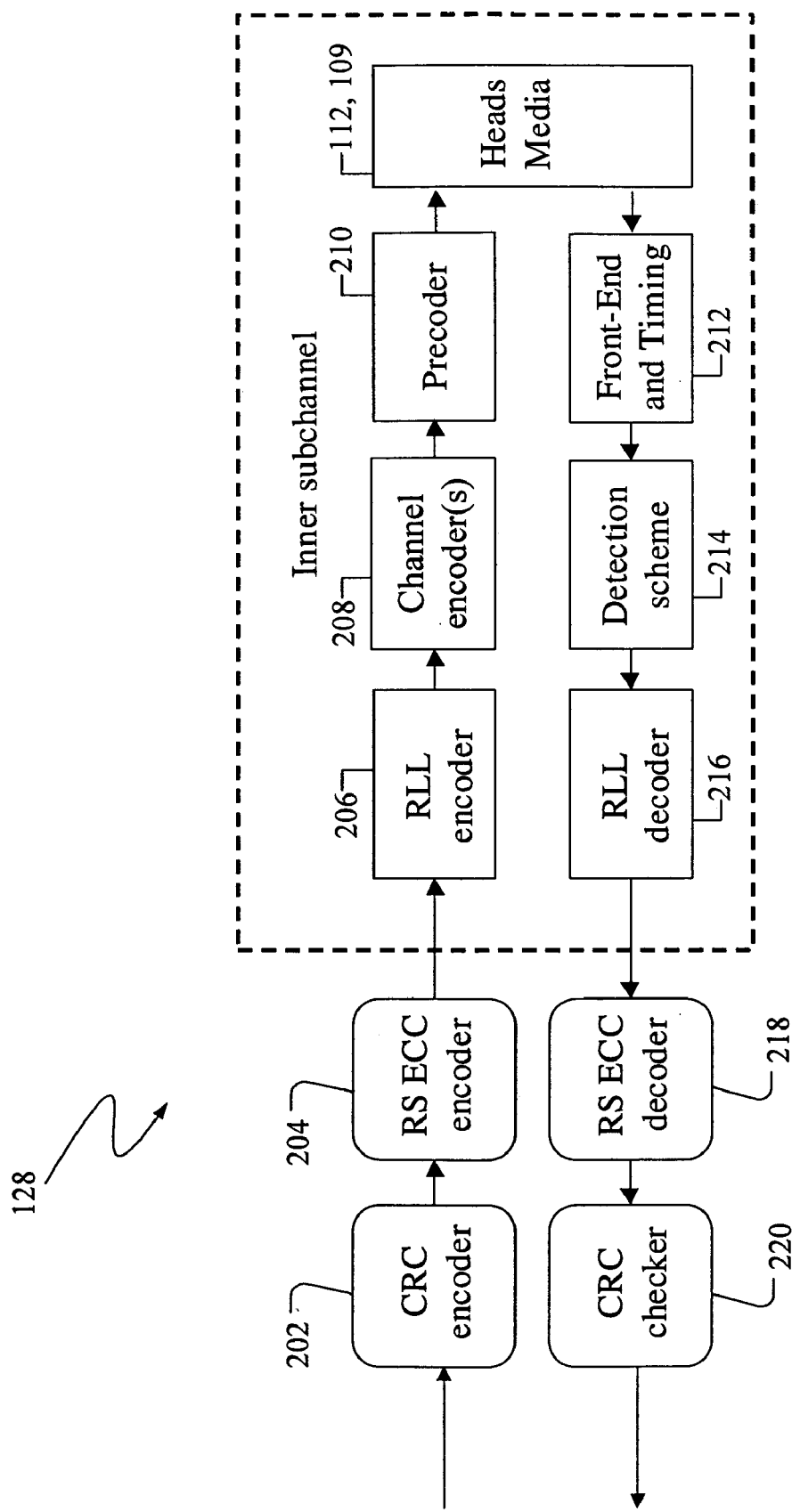
FIG. 2 is a block diagram illustrating a read channel architecture in which the embodiments of the present invention can be implemented.

FIG. 2 is a block diagram illustrating circuitry 128 used to implement the channel architecture in some embodiments of the invention in which a data head interacts with a recording media, for example in disc drives or other data storage systems. Although shown in FIG. 2 in the context of a data storage system, the low density parity check code generating systems and methods of the present invention are not limited to use in data storage apparatus, but instead can be used in other environments such as in communications systems.

As shown in FIG. 2, the channel architecture can include a number of different encoding/decoding circuits, each encoding or decoding data in different manners for different purposes. The various circuits shown in the blocks of FIG. 2 can be implemented as integrated circuits, discrete components, or suitably programmed processing circuitry. For discussion purposes, various blocks shown in FIG. 2 are referred to generically as being circuitry.

As shown in FIG. 2, data bits of a message word to be recorded on the recording media 109 are provided to cyclic redundancy check (CRC) encoder circuit 202 and then to RS error correcting code (ECC) circuit 204. Cyclic redundancy check encoder circuit 202 encodes the data using coding techniques of the type which are well known in the art in order to minimize mis-correction of errors in the decoding process. Error correcting code circuit 204 introduces additional bits to the message data bits. The additional bits improve the ability of the system to recover the signal when the encoded signal has been corrupted by noise introduced by the recording channel. The order of CRC encoder circuit 202 and ECC encoder circuit 204 is not limited to the specific arrangement illustrated in FIG. 2. Also, circuitry 128 shown in FIG. 2 includes a RS ECC decoder circuit 218 and a CRC checker circuit 220 in order to decode and CRC check data read back from the media using heads 112.

Within the inner sub-channel are run length limited (RLL) encoder 206 and decoder 216, which are of the type well known in the art. Run length limited encoder 206 can, in other embodiments, be implemented before RS ECC encoder if desired. Similar repositioning of RLL decoder 216 would also occur in these other embodiments. Channel encoder circuitry 208 encodes the data with LDPC codes generated in accordance with the present invention which is described below in greater detail. Although shown in a particular location in FIG. 2, channel encoder circuitry 208 can be implemented prior to RLL encoder circuit 206 in other embodiments.

Precoder circuit 210 is optionally included in the inner sub-channel and can be used to implement a code of rate 1/1. Generally, precoder circuit 210 is used to eliminate catastrophic error events and/or to convert the data from binary to another format. Front-end and timing circuit 212 filters and converts an analog read back signal from the head into a digital signal, providing timing for sampling of the read back signal. Detection scheme circuitry 214 converts the digital signal into a binary (i.e., 1's and 0's) signal.

1. Theoretical Basis of the Method

The balanced incomplete block design (BIBD) is a pair (V,B), where V is a v-set and B is a collection of b k-subsets of V, called blocks, such that each element of V is contained in exactly r blocks, and such that any 2-subset of V is contained in exactly $\lambda$ blocks. Since $bk=vr$, and $\lambda(v-1)=r(k-1)$, the notation $(v,k,\lambda)$-BIBD is used for a BIBD with v points, block size k, and index $\lambda$. The BIBD with a block size of k=3 is called the "Steiner triple system." A Steiner triple system with $\lambda=1$ is called the "Kirkman system." For example, the collection $B=(B_1, B_2, \ldots, B_7)$ of the blocks: $B_1=\{0,1,3\}$, $B_2=\{1,2,4\}$, $B_3=\{2,3,5\}$, $B_4=\{3,4,6\}$, $B_5=\{0,4,5\}$, $B_6=\{1,5,6\}$, $B_7=\{0,2,6\}$, is an example of the (7,3,1) Kirkman system with v=7, and b=7. As defined herein, the point block incidence matrix of a pair (V,B) is a v×b matrix $A=(a_{i,j})$, in which $a_{i,j}=1$ if the i-th element of V occurs in the j-th block of B, and $a_{i,j}=0$ otherwise. The point block incidence matrix A of the system in this example is shown in Equation (1) of FIG. 3-1.

Each block is incident with the same number k of points, and every point is incident with the same number r of blocks. If b=v and r=k, the BIBD is called symmetric. The concepts of a symmetric $(v,k,\lambda)$-BIBD with $k \geq 3$ and a finite projective plane are equivalent. Considering points as parity check equations and blocks as bits in a linear block code, then A defines a parity check matrix H of a Gallager code. Gallager codes are known in the art. The row weight is r, the column weight is k, and the code rate is $R=(b-\text{rank}(H))/b$.

The first column of matrix A corresponds to block $B_1$ in that it represents that the first bit is "connected" to the zero check point, the first check point and the third checkpoint. The second through seventh columns of matrix A correspond to blocks $B_2$ through $B_7$ in the example given above, with the numbers in each block indicating the checks to which the bit is connected.

It has been shown that in Additive White Gaussian Noise (AWGN) channels long Gallager codes with random sparse parity check matrices (referred also as low density parity check codes) can achieve near-optimum Bit Error Rates (BERs) when decoded using iterative algorithms based on belief propagation in graphs. To visualize the decoding algorithm, the parity check matrix is represented as a bipartite graph with two kind of vertices, as is known in the art. An example of a bipartite graph for a Kirkman (7,3,1) system whose incidence matrix is given above, is shown in FIG. 4. The first subset is comprised of bits (illustrated generally at 250 in FIG. 4), and the second one is a set of parity check equations or points (illustrated generally at 252 in FIG. 4). An edge between the bit and the check exists, if the bit is involved in the check. Note that in the bipartite graph shown in FIG. 4, there are three checks per bit as illustrated by the three connections between each bit and the available checks. Translated to the block design terminology, the two sets of vertices are V and B, and an edge between the point a and $B_i$ exists if a is in $B_i$. In other words, H is the point block incidence matrix A.

Note that using a projective geometry to construct a code would result in an equivalent symmetric BIBD. Since for symmetric BIBDs the number of parity checks is equal to the number of bits (b=v), the code rate is very low (slightly above 1/2). Therefore, for high-rate applications, the projective geometry is not very useful. Since those of skill in the art are likely to be more familiar with the bipartite graph terminology, an attempt is made to emphasize the equivalence between the two in every step of a code design.

Notice that it is desirable to have each bit "checked" in as many equations as possible, but because of the iterative nature of the decoding algorithm, the bipartite graph must not contain short cycles. In other words, the graph "girth" (the length of the shortest cycle) must be large. These two requirements are contradictory, and the tradeoff is especially difficult when the goal is to construct a code that is both short and of a high-rate. The girth constraint is equivalent to the constraint that every t-element subset of V is contained in as few blocks as possible. If each t-element subset is contained in exactly $\lambda$ blocks, the underlying design is known as a "t-design." An example of a 5-design is the extended ternary Golay code. However, the rates of codes based on t-designs (t>2) are quite low, and therefore the analysis is restricted to the 2-designs, i.e. BIBD, or more specifically to the designs with the index $\lambda=1$. The $\lambda=1$ constraint means that no more than one block contains the same pair of points, or equivalently that there are no cycles of length four in a bipartite graph. It also equivalent to the constraint that no pair of columns of a parity check matrix contains two ones at the same positions.

From the fact that $r(k-1)=\lambda(v-1)$, and that bk=vr, it follows that the code rate R is given by Equation (2) shown in FIG. 3-1. This Equation holds for general t-designs, t>1, as well. FIG. 5 plots the required code lengths b for a given code rate $(R=(b-v)/b)$ for codes based on the BIBD(v,2,1) and BIBD(v,3,1) systems. In experiments, codes with k=3 have exhibited somewhat better error performance. Also, the construction of maximum rate BIBD codes with k=2 is trivial.

From FIG. 5, it can be seen that the lengths of short cycle-free codes of rates R>0.9 must be b>500. The cycle length distribution can be easily obtained from the incidence matrix. The "coupling" matrix $C=(c_{i,j})$ is defined herein as $C=A^T A - \text{diag}(A^T A)$. The element $c_{i,j}$ gives the number of points (checks) that are shared by the blocks (bits) i and j. The element $c_{i,i}^{(l)}$ of a $C^l$, l>1 gives the numbers of loops of length l in which each block (bit) j is involved. The diag($C^l$), l>1, gives the "l-th level coupling profile." The block i with $c_{i,j}^{(2)}>0$ is referred as a "tightly coupled." For (v,k,1)-BIBD designs, C=J−I, where I is the identity matrix, and J is the b×b all-one matrix. Since C is symmetric, the coupling profile is uniform.

Code Design

It has been shown in the above discussion that the concept of Steiner systems offers a tool for designing codes without short cycles. Since codes constructed in this way are structured, they can lend themselves to a low complexity implementation. In this section, a simple construction of Steiner systems is defined using difference families of Abelian groups.

Let V be an additive Abelian group of order v. Then t k-element subsets of V, $B_i=\{b_{i,1}, \ldots, b_{i,k}\} 1 \leq i \leq t$, form a (v,k,1) "difference family" (DF) if every nonzero element of V can be represented exactly λ ways as a difference of two elements lying in a same member of a family, i.e., occurs λ times among the differences $b_{i,m}-b_{i,n}$, $1 \leq i \leq k$, $1 \leq m,n \leq k$. In a (v,k,1) DF, λ is equal to one. The sets $B_i$ are called "base blocks." If V is isomorphic with $Z_v$, a group of integers modulo v, then a (v,k,1) DF is called a "cyclic difference family" (CDF). For example, the block $B_1=\{0,1,3\}$ is a base block of a (7,3,1) CDF. To illustrate this, one can create an array $\Delta=(\Delta_{i,j})$ of differences $\Delta_{i,j}=(b_{1,i}-b_{1,j})$ mod 7 as shown in Equation (3) in FIG. 3-1.

For example, with $B_1=\{0,1,3\}$ as defined above, the first row of $\Delta_1$ is 0,6,4. The first element, 0, is calculated as 0−0=0. The second element, 6, is calculated as 0−1=−1 (which is 6 in modulo 7). The third element, 4, is calculated as 0−3=−3 (which is 4 in modulo 7).

The second row of $\Delta_1$ is 1,0,5. The first element, 1, is calculated as 1−0=1. The second element, 0, is calculated as 1−1=0. The third element, 5, is calculated as 1−3=−2 (which is 5 in modulo 7).

The third row of $\Delta_1$ is 3,2,0. The first element, 3, is calculated as 3−0=3. The second element, 2, is calculated as 3−1=2. The third element, 0, is calculated as 3−3=0. In the methods of the present invention, the array should be designed such that in any matrix (for example $\Delta_1$), all non-zero elements must be unique (occur no more than once).

As it can be seen in Equation (3), each nonzero element of $Z_7$ occurs only once in $\Delta_1$. One can also think of the actions of this group as partitioning B into classes or orbits. A set of orbit representatives is a set of base blocks. Given base blocks, the blocks $B_j, 1 \leq j \leq t$, the orbit containing $B_j$, can be calculated as $B_j=\{b_{j,1}+g, \ldots, b_{j,k}+g\}$ where g goes over all the elements from V. A construction of BIBD is completed by creating orbits for all base blocks. For example, it can be easily verified (by creating the array Δ) that the blocks $B_1=\{0,1,4\}$ and $B_2=\{0,2,7\}$ are the base block of a (13,3,1) CDF of a group $V=Z_{13}$. The two orbits are given in Table 1 shown in FIG. 3-3.

If the number of difference families is t, the number of blocks in a BIBD is b=tv. The parity check matrix corresponding to the (13,3,1) BIBD in TABLE 1 is shown in FIG. 11. This matrix contains only the weight 3 columns. Of course, since the order of the group in our example is small, the code rate is low (R=1/2). The codes based on $Z_v$ are particularly interesting because they are conceptually extremely simple and have the structure that can be easily implemented in hardware. Notice also that for a given constraint (v,k,1) the BIBD based construction maximizes the code rate as can be seen using Equation 2 in FIG. 3-1. Code rate is independent of the underlying group as long as the base blocks belong to a CDF, so that no two orbits overlap. Other groups may possibly lead to similar or better codes, but they are not discussed further in this application.

Construction of Cyclic Difference Families

It is straightforward to construct a BIBD design once CDF is known. However, finding CDF is a much more complicated problem and solved only for some values of v,k and λ. In this section, construction of a CDF is described. In order to keep the discussion simple, the Kirkman system difference families are used. These difference families were constructed by Netto more than a century ago. Netto's construction is applicable if v is a prime v≡1 (mod 6). When v is a power of prime, then $Z_v$ is a Galois field GF(v), and we can define a multiplicative group Ψ of the field.

Let ω be a generator of the multiplicative group (a primitive element in GF(v)). Write v as v=6t+1, t≥1, and for d a divisor of v−1, denote by $\Psi^d$ the group of d-th powers of ω in GF(6t+1), and by $\omega^i \Psi^d$ the co-set of d-th powers of $w^i$. Then, the set $\{\omega^i \Psi^{2t} | 1 \leq i \leq t\}$ defines the Kirkman (6t+1, 3,1) difference family. Provided in this disclosure is an intuition behind this result, rather than the details of the proof.

FIG. 6 depicts GF(6t+1). The group can be generated by a primitive element $\omega^1=2$. The powers of ω are shown as points on a circle (labeled also by the integer values inside the circle). Since the order of ω is v−1=12, $\omega^{12}=1$. The groups of 2t=4 powers of $\omega^1$ are shown as star like sets (or clock hands). The two 3-sets $B_1\{2,5,6\}$ and $B_2=\{4,10,12\}$ are base blocks of a Kirkman (13,3,1) system. $B_1$ and $B_2$ are equally spaced around the circle and all other triplets can be obtained by adding g∈{1,2, ..., 12}, i.e., by rotating the stars (the hands) counterclockwise and reading off the elements covered by the hands. As an illustration the base blocks for some small primes are given in Table 2 illustrated in FIG. 3-3.

Tables 3 and 4 shown in FIG. 3-4 give a list of base blocks for other high rate (R>9/10) Kirkman codes. They are constructed using CDF described above. Note than the rate of the longest code is very high, R=0.962. Two or more DFs involving different groups of bits as BIBD blocks can be combined to create a code of length 4096.

2. Description of the Method

Encoding. As shown previously, a difference family completely describes the positions of nonzero elements in a parity check matrix. Given a (v,k,1) CDF, as t k-element subsets of $Z_v$, with base blocks $B_i=\{b_{i,1}, \ldots, b_{i,k}\}$, $1 \leq i \leq t$, the parity check matrix can be written in the form $H=[H_1 H_2 \ldots H_t]$, where each sub-matrix is of the dimensions v×v. For Kirkman codes, rank($H_i$)=v for all $1 \leq i \leq t$, and in general rank($H_i$)≤v. Assuming that the codeword c is a column vector of length tv, and using the fact that Hc=0, we have the relationship of Equation (5) shown in FIG. 3-1. In Equation (5), m is a column vector consisting of (t−1)v data bits, and p is column vector consisting of v parity bits. The parity bits can be calculated from the expression shown in Equation (6) in FIG. 3-1.

Parsing the message vector into t−1 sub-vectors of the dimensions v, so that $m=[m^{(1)}\ m^{(2)} \ldots m^{(t-1)}]^T$, Equation (6) becomes as shown in Equation (7) shown in FIG. 3-1. Equation (7) leads to a simple hardware implementation of the encoding process. Note first that the encoder can work independently on message vectors $m^{(1)}, m^{(2)}, \ldots, m^{(t-1)}$ to compute the products $\beta_i = H_i \times m^{(i)}$. Each of these operations is a Matrix-Vector-Multiplication (MVM), and can be carried out in some embodiments of the invention by a unit called MVM1 of the decoder, which is discussed later in greater detail. The left-hand side of Equation 6 is now $\beta_1 + \beta_2 + \ldots + \beta_{t-1} = \beta$. When the vector β is found, the parity bits are calculated as shown in Equation (8) shown in FIG. 3-1. This operation is also of the MVM type, and is carried out in an example embodiment by a unit called MVM2 in the encoder.

There are different ways to implement the encoder using MVM1 and MVM2 units. Here, we describe some specific implementations of the encoder for the parity check matrix H constructed from cyclic sub-matrices $H_i, 1 \leq i \leq t$. In this case, within every sub-matrix $H_i$ each column $h_j^{(i)}$ is a cyclic shift of the previous column, that is that $h_j^{(i)} = S(h_{j-1}^{(i)})$, where S is a cyclic shift operator and $2 \leq j \leq v$. The first column of $H_i$ has the nonzero elements at the positions given by $B_i$, and will be denoted by $h^{(i)} = (h_{i,1}, h_{i,2}, h_{i,v})$. FIG. 7 is a diagrammatic illustration of the structure of a parity check matrix H used to create the new LDPC codes in accordance with the invention. In the example illustrated in FIG. 7, a few of the twenty seven (t=27) base blocks or sub-matrixes $H_i$ are shown. Base block 302 corresponds to sub-matrix $H_1$ of H, while base blocks 304 and 306 correspond to the $H_2$ and $H_{27}$ sub-matrixes of H. Note that within each of these base blocks or sub-matrixes, each column following the first column is cyclic (i.e., a shifted version of the first column).

It is worthy of note that in a (v,k,1) CDF, when v is not a prime number, but is a prime power (i.e., $x^y$, where x is a prime number), the columns of $H_i$ are not simple cyclic shifts of a previous column, but nevertheless they can be generated as consecutive states of a maximum-length shift register with a primitive polynomial P(x). The root of this polynomial ω is the generator of the multiplicative group in GF(v) used to generate difference set from a base block. When v is a prime, the polynomial is $P(x) = 1 + x^{v-1}$.

FIG. 8 is a schematic block diagram of a serial type encoder 340 which is configured to implement methods of the present invention. Encoder 340 includes MVM1 unit 345 and MvM2 unit 360 as described above. MVM1 unit 345 of encoder 340 includes read only memory ROM 350, shift register SR1 (designated generally at 352), v AND gates 354, v EXCLUSIVE-OR gates 356, and memory register MR1 (designated generally at 358). Read only memory 350 stores base blocks $H_i$ of parity check matrix H. The base blocks are sequentially loaded into the shift register SR1 used to generate columns of H. Shift register SR1 is shown as individual blocks or storage locations designated $h_1^{(i)}$ through $h_v^{(i)}$. After loading $h^{(i)} = (h_{i,1}, h_{i,2}, h_{i,v})$, the contents of this shift register SR1 is cyclically shifted v times to generate columns of the sub-matrix $H_i$. When the column $h^{j(i)}$ is formed in this shift register, the column is multiplied by the corresponding data bit $m_j^{(i)}$ using v AND gates 354, and added component-wise in EXCLUSIVE-OR gates 356 to the already accumulated value of β stored in the memory register MR1. Finally, the parity check bits are calculated by the multiplication, in the unit MVM2, of the β column stored in memory register MR1 and $H_t^{-1}$. This encoding process can be summarized by the pseudo-code shown in FIG. 3-2.

While working on the sub-matrix $H_i$, the unit MVM1 of encoder 340 performs the following operations at each clock cycle:
1) bit shift of a length V vector (to find the next column of $H_i$);
2) v Boolean AND operations (multiplying message bit $m_j^{(i)}$ and $h_j^{(i)}$); and
3) v Boolean EXCLUSIVE-OR operations ($\beta_i = \beta_i + m_j^{(i)} \cdot h_1^{(i)}$).

The inverse of the matrix $H_t$ is pre-calculated and stored in unit MVM2. The inverse of a cyclic matrix is often also cyclic, which means that the memory required for storing $H^{-1}$ is not $v^2$, as might seem initially apparent. Instead, the memory required for storing $H_t^{-1}$ is only v, because only one column of $H_t^{-1}$ needs to be stored. The encoder complexity is therefore a linear function in v, the number of parity bits.

Another implementation MVM1 unit or circuit 345 for cyclic sub-matrices $H_i$ is shown in FIG. 9. In the MVM1 unit or circuit shown in FIG. 9, the feedback of the MVM1 units is defined by the first column of the current sub-matrix $H_i$, and is fixed while we feed in v data bits $m_j^{(i)}, 1 \leq j \leq v$. The first column of the sub-matrix $H_i$, designated $h_{i,1}$ through $h_{i,v}$ in FIG. 9, is multiplied by the corresponding data bit $m_j^{(i)}$ using v AND gates 380, and is again added component-wise in EXCLUSIVE-OR gates 382 to the already accumulated value of β stored in a memory register.

A parallel-serial type of encoder 400 in accordance with the invention is shown in FIG. 10. This implementation uses t−1 MVM1 units 405 with fixed feedback as was shown in FIG. 9. In this case, only a small number of the multipliers corresponding to the nonzero values of $h^{(i)} = (h_{i,1}, h_{i,2}, h_{i,v})$ is left in each MVM unit, while others are deleted. The outputs of the MVM1 units 405 are added using adder 410 to generate the value of β ($\beta_1 + \beta_2 + \ldots + \beta_{t-1} = \beta$) The MVM2 unit 360 calculates the parity check bits p in the same manner discussed above. The following two specific cases clarify this simplification:

Encoder based on the Kirkman (13,3,1) system: The parity-check matrix of a LDPC code has the column weight k=3, or in other words each code bit has three orthogonal parities. The base blocks and the orbits of this system are listed in Table 1 shown in FIG. 3-3. The parity-check matrix H is given in Equation (9) shown in FIG. 11. The inverse matrix $H_2^{-1}$ is a circulant with the first column h=(1,0,0,0, 1,1,1,0,1,0,1,1,0). The other columns of $H_2^{-1}$ are cyclic (down) shifts of the first column h. The complete block diagram of the corresponding encoder is shown in FIG. 12.

Encoder 500 shown in FIG. 12 includes MVM1 unit 505 and MVM2 unit 510. MVM1 unit 505 includes a shift register having thirteen storage bins 515 and multiple adders 520. The number of storage bins 515 corresponds to the number of elements in each column of matrix H illustrated in FIG. 11. The adders are positioned such that, after thirteen data bits are shifted into the register at input 525, the data contained in the storage bins is equivalent to multiplication of the data bits by the first column of the first sub-matrix $H_1$ (left hand side) of matrix H illustrated in FIG. 11.

After the thirteen bits are shifted into the shift register of MVM1 unit 505, switch 530 is closed and the contents of the storage bins 515 are shifted into MVM2 unit 510. It is important to note that switch 530 is not necessarily indicative of a physical switch, but instead is indicative of a switching function which isolates MVM1 unit 505 and MVM2 unit 510 until the appropriate time. MVM2 unit 510 includes a shift register also having thirteen storage bins 535 and multiple adders 540. The adders 540 are positioned such that, after bits are shifted into the register at input 545 from MVM1 unit 505, the data contained in the storage bins is equivalent to multiplication of the contents of the MVM1 shift register by the inverse of the first column of the second sub-matrix $H_2$ (i.e., inverse of the right hand side) of matrix H illustrated in FIG. 11. The encoded data can then be retrieved from the shift register of MVM2 unit 510.

Encoder based on the (v,2,1)-BIBD: The parity-check matrix of this LDPC code has a column weight k=2, and therefore only two orthogonal parities control each code bit. For v=7, for example, one can use the base blocks {0,2}, {0,3} and {0,1}, which give the parity-check matrix H=[$H_1$ $H_2$ $H_3$], where $H_1$, $H_2$ and $H_3$ are as shown in Equation (10) in FIG. 3-2. Looking at the first H sub-matrix $H_1$, the "1's" in the zero position and in the second position of the first column correspond to the base block {0,2}. In the sub-matrix $H_2$, the "1's" in the zero position and in the third position correspond to the base block {0,3}. In the sub-matrix $H_3$, the "1's" are in the zero position and in the first position of the first column, corresponding to base block {0,1}. In each sub-matrix, all columns are circular shifts of the first column.

Since in the case of k=2 the rows of H are always linearly dependent, for encoding purposes one can delete some number of rows and columns, and construct a new parity check matrix with independent rows. In this example, we delete all the last rows and the last column of $H^{(3)}$ in Equation (10). Therefore, for calculation of six parity bits as described by Equations (5)–(8), we use the matrices shown in Equation (11) of FIG. 3-2.

A block diagram of a complete parallel-serial encoder 600 for this example is shown in FIG. 13. With three base blocks of matrix H, the first two base blocks are implemented using two appropriately configured MVM1 units 605 and 610. As was in the case in the preceding example, the MVM1 units 605 and 610 have shift registers in which the storage bins are separated by adders positioned to multiply the incoming data bits of first and second data blocks by the first column of the corresponding sub-matrixes or blocks $H_1$ and $H_2$, respectively. The contents of the shift registers of units MVM1 and MVM2 are then summed at adder 620 and shifted through unit MVM2 615 (via switch 625) to generate the parity bits. The unit MvM2 615 is configured to multiply the bit-wise summation of the contents of the MVM1 and MVM2 units by the inverse of the first column of the third sub-matrix $H_3$.

FIG. 14 is a plot illustrating the bit error rates (BER) of different Kirkman LDPC codes calculated in accordance with the present invention.

Figure 15:
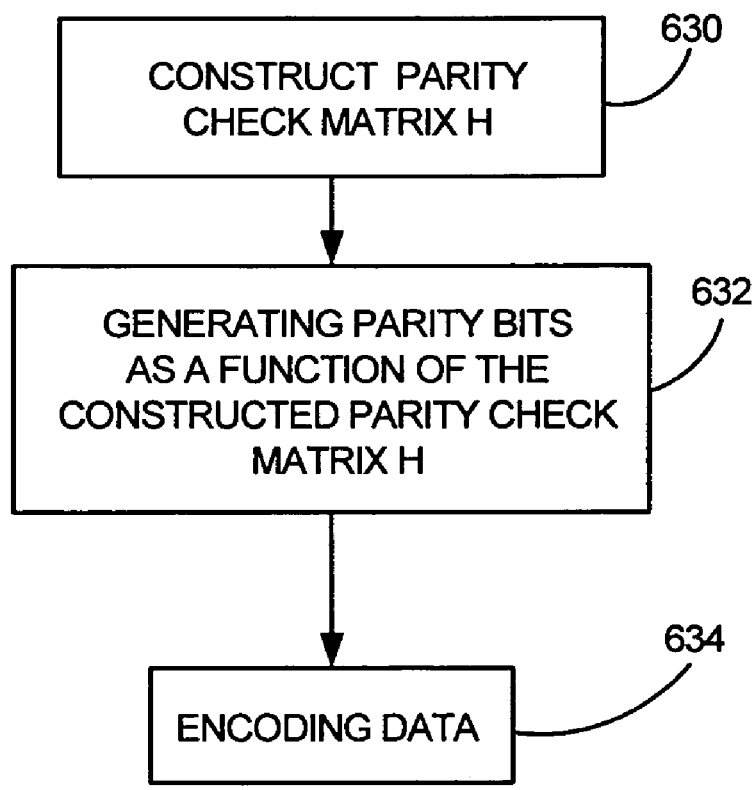
FIG. 15 is a block diagram showing steps the method of the invention.

In summary, referring to FIG. 15, the present invention includes a method of generating low density parity check codes for encoding 634 data. In some embodiments, the method includes constructing 630 a parity check matrix H having a balanced incomplete block design (BIBD) in which a plurality B-sets which define the matrix have no more than one intersection point. The method can also includes generating 632 parity bits as a function of the constructed parity check matrix H.

Constructing the parity check matrix can also include constructing the parity check matrix H such that, for each v×v sub-matrix of the parity check matrix H, V being the number of bits in each row and column of each sub-matrix, each column of the sub-matrix contains the same number of 1's as all other columns of the sub-matrix. Further constructing the parity check matrix can include constructing the parity check matrix H such that, for each v×v sub-matrix of the parity check matrix H, each column after a first column is a circular shift of the first column. Also, the parity check matrix H is constructed such that each column of the matrix contains the same number of 1's as all other columns of the matrix, and such that no pair of columns in the parity check matrix contains two 1's at the same positions.

The BIBD of the parity check matrix H is a pair (V,B), where V is a v-set and B is a collection of b k-subsets of V, each k-subset defining a block, such that each element of V is contained in exactly r blocks, and such that any 2-subset of V is contained in exactly λ blocks. In some embodiments of the methods and apparatus of the present invention, λ is equal to 1. A (v,k,λ)-BIBD is a BIBD with v points, block size k, and index λ, and in the present invention, constructing the parity check matrix can further include constructing the parity check matrix such that it has a (v,k,1)-BIBD. For example the present invention includes embodiments in which the parity check matrix is constructed such that it has a has a (v,3,1)-BIBD or a (v,2,1)-BIBD. Other values of k are also possible using the methods and apparatus disclosed herein.

The parity check matrix includes t sub-matrices [$H_1$ $H_2$ ... $H_t$] such that H=[$H_1$ $H_2$ ... $H_t$], and wherein m is a column vector consisting of (t−1)v data bits. In some embodiments, generating the parity bits further includes generating a column vector p consisting of v parity bits using the relationship [$H_1$ $H_2$ ... $H_{t-1}$]×m=$H_t$×p.

The present invention also includes an encoder 208, 400, 500, and/or 600 for encoding message data with a low density parity check code. The encoder includes a first matrix vector multiplier (MVM) which receives a v-bit set of message data and multiplies the v bit set of message data by a first column of a first sub-matrix of a low density parity check matrix H having a balanced incomplete block design (BIBD) in which multiple B-sets which define the matrix have no more than one intersection point, the first MVM producing a first MVM output as a function of the multiplication. The encoder also includes a second MVM 360, 510, and/or 615 which receives the first MVM output and generates parity bits by multiplying the first MVM output by the inverse of a first column of a last sub-matrix of the low density parity check matrix H.

In some embodiments of the present invention, the first MVM includes multiple first MVM units 345, 405, 505, 605 and/or 610 or the like, each receiving a different v-bit set of message data and multiplying its corresponding received v-bit set of message data by a first column of a different one of a plurality of sub-matrices of the low density parity check matrix H. In these embodiments, the first MVM produces the first MVM output as a function of a combination of the multiplication results in each of the plurality of first MVM units.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the LDPC code generating method and circuit while maintaining substantially the same functionality without departing from the scope and spirit of the present invention. In addition, although the embodiments described herein are directed to LDPC code methods and circuits for disc drive data storage systems, it will be appreciated by those skilled in the art that the teachings of the present invention can be applied to other systems, like magnetic tape data storage systems, optical storage systems, and communication systems without departing from the scope and spirit of the present invention.

What is claimed is:

1. A method of generating low density parity check codes for encoding data, the method comprising:

constructing a parity check matrix H having a balanced incomplete block design (BIBD) in which a plurality of Bsets which define the matrix have no more than one intersection point, the parity check matrix H being constructed such that for each v×v sub-matrix of the parity check matrix H, v being the number of bits in each row and column of each sub-matrix, each column of the sub-matrix contains the same number of 1's as all other columns of the sub-matrix, and such that for each v×v sub-matrix of the parity check matrix H, each column after a first column is a circular shift of the first column;

generating parity bits as a function of the constructed parity check matrix H;

encoding a data signal using the generated parity bits to generate an encoded data signal having a reduced bit error rate associated therewith; and configuring an encoder to encode the digital data signal using the generated parity bits to generate the encoded data signal having the reduced bit error rate associated therewith.

2. The method of claim 1, wherein constructing the parity check matrix further comprises constructing the parity check matrix H such that each column of the matrix contains the same number of 1's as all other columns of the matrix.

3. The method of claim 2, wherein constructing the parity check matrix further comprises constructing the parity check matrix H such that no pair of columns in the parity check matrix contains two 1's at the same positions.

4. The method of claim 3, wherein constructing the parity check matrix further comprises constructing the parity check matrix H such that the BIBD is a pair (V,B), where V is a v-set and B is a collection of b k-subsets of V, each k-subset defining a block, such that each element of V is contained in exactly r blocks, and such that any 2-subset of V is contained in exactly $\lambda$ blocks, and wherein $\lambda$ is equal to 1.

5. The method of claim 4, wherein a (v,k,$\lambda$)-BIBD is a BIBD with v points, block size k, and index $\lambda$, and wherein constructing the parity check matrix further comprises constructing the parity check matrix such that the parity check matrix has a (v,k,1)-BIBD.

6. The method of claim 5, wherein the parity check matrix includes t sub-matrices [$H_1$ $H_2$ . . . $H_t$] such that H=[$H_1$ $H_2$ . . . $H_t$], and generating the parity bits further comprising generating a column vector p consisting of v parity bits using the relationship [$H_1$ $H_2$ . . . $H_{t-1}$]×m=$H_t$×p wherein m is a column vector consisting of (t−1)v data bits.

7. The method of claim 4, wherein constructing the parity check matrix further comprises constructing the parity check matrix such that the parity check matrix has a (v,3,1)-BIBD.

8. The method of claim 4, wherein constructing the parity check matrix further comprises constructing the parity check matrix such that the parity check matrix has a (v,2,1)-BIBD.

9. The method of claim 1, and further comprising storing data, based upon the generated encoded data signal, in a storage device.

10. The method of claim 1, and further comprising storing data, based upon the generated encoded data signal, in a storage device to thereby store user data in a format with a reduced number of errors.

11. An encoder for encoding message data with a low density parity check code, the encoder comprising:

a first matrix vector multiplier (MVM) which receives a v-bit set of message data and multiplies the v bit set of message data by a first column of a first sub-matrix of a low density parity check matrix H having a balanced incomplete block design (BIBD) in which a plurality B-sets which define the matrix have no more than one intersection point, the first MVM producing a first MVM output as a function of the multiplication; and a second MVM which receives the first MVM output and generates parity bits by multiplying the first MVM output by the inverse of a first column of a last sub-matrix of the low density parity check matrix H.

12. The encoder of claim 11, wherein the first MVM comprises a plurality of first MVM units each receiving a different v-bit set of message data and multiplying its corresponding received v-bit set of message data by a first column of a different one of a plurality of sub-matrices of the low density parity check matrix H, the first MVM producing the first MVM output as a function of a combination of the multiplication results in each of the plurality of first MVM units.

13. The encoder of claim 11, the parity check matrix H comprises a plurality of v×v sub-matrices and wherein for each v×v sub-matrix of the parity check matrix H, v being the number of bits in each row and column of each sub-matrix, each column of the sub-matrix contains the same number of 1's as all other columns of the sub-matrix.

14. The encoder of claim 13, wherein for each v×v sub-matrix of the parity check matrix H, each column after a first column is a circular shift of the first column.

15. The encoder of claim 14, wherein each column of the parity check matrix H contains the same number of 1's as all other columns of the parity check matrix.

16. The encoder of claim 15, wherein no pair of columns in the parity check matrix H contains two 1's at the same positions.

17. The encoder of claim 16, wherein the parity check matrix H is a (v,k,$\lambda$)-BIBD, where a (v,k,$\lambda$)-BIBD is a BIBD with v points, block size k, and index $\lambda$, and wherein index $\lambda$ is equal to one.

18. An apparatus for encoding digital information with a low density parity check code, the apparatus comprising:

an input which receives a sequence of message bits;

means for generating parity bits as a function of the sequence of message bits and as a function of a parity check matrix H having a balanced incomplete block design (BIBD) in which a plurality Bsets which define the matrix H have no more than one intersection point;

means for encoding a data signal using the generated parity bits to generate an encoded data signal having a reduced bit error rate associated therewith; and means for configuring an encoder to encode the digital data signal using the generated parity bits to generate the encoded data signal having the reduced bit error rate associated therewith.

19. An encoder for encoding message data with a low density parity check code, the encoder comprising:

a first matrix vector multiplier (MVM) means for receiving a v-bit set of message data and multiplying the v bit set of message data by a first column of a first sub-matrix of a low density parity check matrix H having a balanced incomplete block design (BIBD) in which a plurality B-sets which define the matrix have no more than one intersection point, the first MVM producing a first MVM output as a function of the multiplication; and a second MVM means for receiving the first MVM output and generating parity bits by multiplying the first MVM output by the inverse of a first column of a last sub-matrix of the low density parity check matrix H.

* * * * *